United States Patent [19]
Inaba

[11] Patent Number: 5,242,861
[45] Date of Patent: Sep. 7, 1993

[54] METHOD FOR MANUFACTURING SEMICONDUCTOR DEVICE HAVING A MULTILAYER WIRING STRUCTURE

[75] Inventor: Takashi Inaba, Tokyo, Japan

[73] Assignee: NEC Corporation, Japan

[21] Appl. No.: 895,551

[22] Filed: Jun. 8, 1992

[30] Foreign Application Priority Data

Jun. 6, 1991 [JP] Japan .................. 3-134544

[51] Int. Cl.⁵ ................................ H01L 21/445
[52] U.S. Cl. ..................... 437/190; 437/195; 437/183; 437/230; 437/246; 427/98
[58] Field of Search .......... 437/228, 192, 195, 182, 437/183, 230, 246; 156/632, 659.1; 427/98

[56] References Cited

U.S. PATENT DOCUMENTS

| | | | |
|---|---|---|---|
| 3,993,515 | 11/1976 | Reichert | 437/246 |
| 3,997,963 | 12/1976 | Riseman | 437/183 |
| 5,098,860 | 3/1992 | Chakravorty et al. | 437/230 |
| 5,130,275 | 7/1992 | Dion | 437/225 |

FOREIGN PATENT DOCUMENTS

| | | | |
|---|---|---|---|
| 60-140737 | 7/1985 | Japan | 437/183 |
| 61-4248 | 1/1986 | Japan | 437/183 |
| 61-183945 | 8/1986 | Japan | 437/183 |
| 1-12553 | 1/1989 | Japan | 437/183 |
| 1-15956 | 1/1989 | Japan | 437/183 |
| 1-120848 | 5/1989 | Japan | 437/183 |
| 2-28932 | 1/1990 | Japan | 437/183 |

*Primary Examiner*—T. N. Quach
*Attorney, Agent, or Firm*—Laff, Whitesel, Conte & Saret

[57] ABSTRACT

In a process for manufacturing a semiconductor device having a multi-layer wiring structure, a silicon oxide film is deposited on the surface of second level wiring conductors formed on a power supply layer for electroplating, and then, the deposited silicon oxide film is etched back so that the silicon oxide film remains only on the side surfaces of the second level wiring conductors. Thereafter, the power supply layer is removed by the sputter etching, and the silicon oxide film is removed together with the metal deposit adhered to the surface of the silicon oxide film at the time of the sputter etching. Accordingly, the short-circuiting of adjacent second level wiring conductors which would be caused because of peeling-off of the metal deposit is prevented.

9 Claims, 3 Drawing Sheets

METHOD FOR MANUFACTURING SEMICONDUCTOR DEVICE HAVING A MULTILAYER WIRING STRUCTURE

BACKGROUND OF THE INVENTION

1. Field of the Invention

The present invention relates to a method of manufacturing a semiconductor device, and more specifically, to a method of forming a multi-layer wiring structure in the process for manufacturing a semiconductor device.

2. Description of Related Art

In one typical conventional method for manufacturing a semiconductor device having a multi-layer wiring structure, a first level level wiring conductor is formed on a silicon oxide film formed on a silicon substrate, and the first level wiring conductor is coated with an interlayer insulator film having a planarized upper surface. A contact hole is formed in the interlayer insulator film at a positioned of the first level wiring conductor.

Thereafter, a power supply layer for electroplating is formed to cover all exposed surfaces. Then, a photoresist layer is deposited on the power supply layer, and then, patterned so as to form grooves for formation of a second level wiring conductor. Some of the grooves is composed to include the contact hole. Then, a second level metal layer is deposited on the power supply layer by an electroplating process using the patterned photoresist layer as a mask.

Thereafter, the photoresist layer is removed so as to form second level wiring conductors, and then, the power supply layer is removed by a sputter etching using the second level wiring conductors as a mask.

In the above mentioned conventional method for manufacturing a semiconductor device, after the second level wiring conductor layer is formed by the electroplating, the sputter etching is performed in order to remove an unnecessary portion of the power supply layer for electroplating. In this process, a portion of a removed metal of the power supply layer is deposited on side surfaces of the second level wiring conductors. A portion of the removed metal deposit adhered to the side surfaces of the second level wiring conductors peels off from the side surfaces of the second level wiring conductors in succeeding processes. As a result, adjacent second level wiring conductors are often short-circuited, with the result that the fabrication yield and the reliability of the products falls down.

SUMMARY OF THE INVENTION

Accordingly, it is an object of the present invention to provide a method of manufacturing a semiconductor device which has overcome the above mentioned defect of the conventional one.

Another object of the present invention is to provide a method of manufacturing a semiconductor device, which method is capable of preventing short-circuiting of adjacent second level wiring conductors so that the fabrication yield and the reliability of the products can be improved.

The above and other objects of the present invention are achieved in accordance with the present invention by a method for manufacturing a semiconductor device, comprising the step of forming an interlayer insulator layer on a semiconductor substrate; forming a power supply layer for electroplating on an upper surface of the interlayer insulator layer; depositing on the power supply layer a patterned photoresist layer having a plurality of grooves for formation of a plurality of wiring conductors; depositing a metal layer on the power supply layer by an electroplating process using the patterned photoresist layer as a mask so that the wiring conductor is formed within each of the grooves; removing the photoresist layer; depositing an insulator film on a surface including a surface of the wiring conductors; etching back the deposited insulator film so that the deposited insulator film remains on only side surfaces of the wiring conductors and the upper surface of the power supply layer is exposed; etch-removing the power supply layer using the wiring conductors and the remaining deposited insulator film as a mask; and etch-removing the remaining deposited insulator film.

The above and other objects, features and advantages of the present invention will be apparent from the following description of preferred embodiments of the invention with reference to the accompanying drawings.

DESCRIPTION OF THE PREFERRED EMBODIMENTS

Referring to FIGS. 1A to 1F, there are shown sectional views of a semiconductor device, for illustrating the process of the first embodiment of the present invention.

Figure 1A:
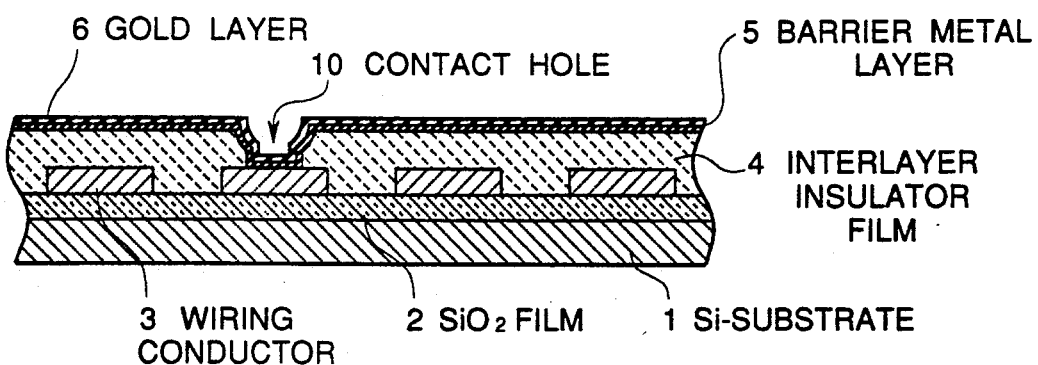
FIGS. 1A to 1F are sectional views of a semiconductor device, for illustrating the process of the first embodiment of the present invention.

As shown in FIG. 1A, an aluminum layer is deposited on a silicon oxide film 2 formed on a silicon substrate 1, and the deposited aluminum layer is patterned so as to form a plurality of lower level wiring conductors 3 having a width of 2 $\mu$m and a thickness of 0.5 $\mu$m. Furthermore, an organic film such as a polyimide film mixed with powdered silica is deposited on a surface of the silicon oxide film 2 including a surface of the wiring conductors 3 by means of a coating process, so as to form an interlayer insulator film 4 having a planarized upper surface. Then, the interlayer insulator film 4 is selectively perforated so as to form a contact hole 10 on one of the wiring conductors 3. Thereafter, a barrier metal layer 5 such as a Ti-W layer and a gold layer 6 having a thickness of 0.1 $\mu$m, respectively, are formed in the named order on a surface of the interlayer insulator film 4 including a surface of the contact hole 10 by sputtering, so that a power supply layer for electroplating is formed.

Figure 1B:
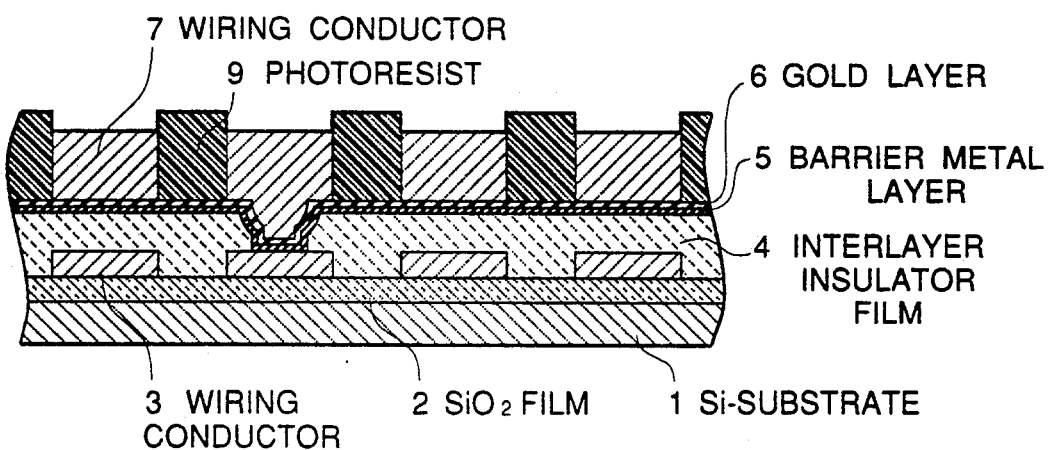

Next, as shown in FIG. 1B, a photoresist layer 9 is deposited on the gold layer 6, and then, patterned so as to form grooves for formation of a wiring conductor pattern, some of the grooves being composed to include the contact hole 10. Then, a gold layer is deposited on the power supply layer (5+6) by an electroplating process using the patterned photoresist layer 9 as a mask.

Figure 1C:
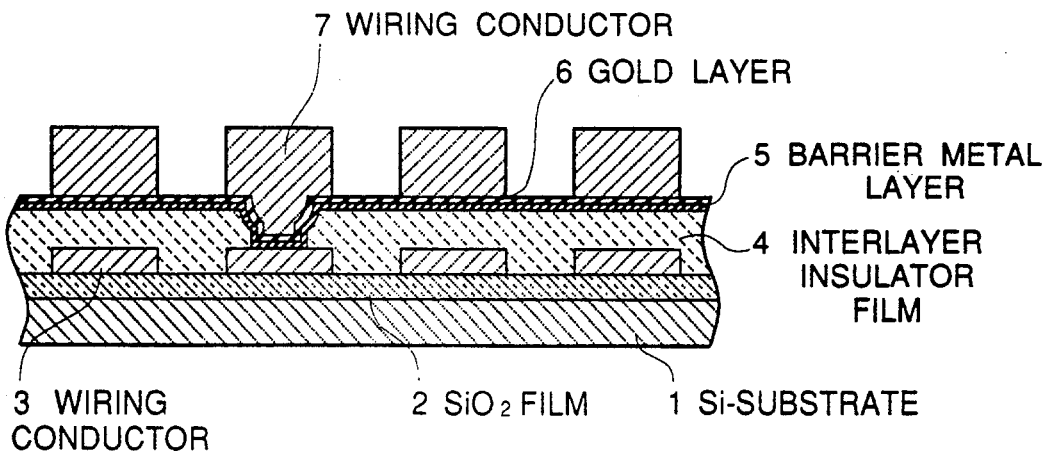

Thereafter, as shown in FIG. 1C, the photoresist layer 9 is removed so as to form upper level wiring conductors 7.

Figure 1D:
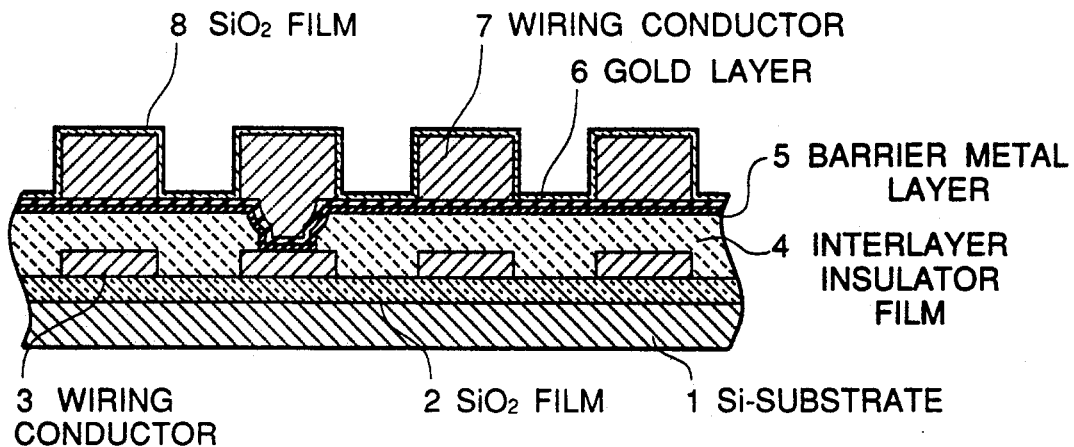

Furthermore, as shown in FIG. 1D, a silicon oxide film 8 having a thickness of 0.2 $\mu$m is deposited on a surface of the power supply layer (5+6) including a surface of the wiring conductors 7, by a plasma CVD process.

Figure 1E:
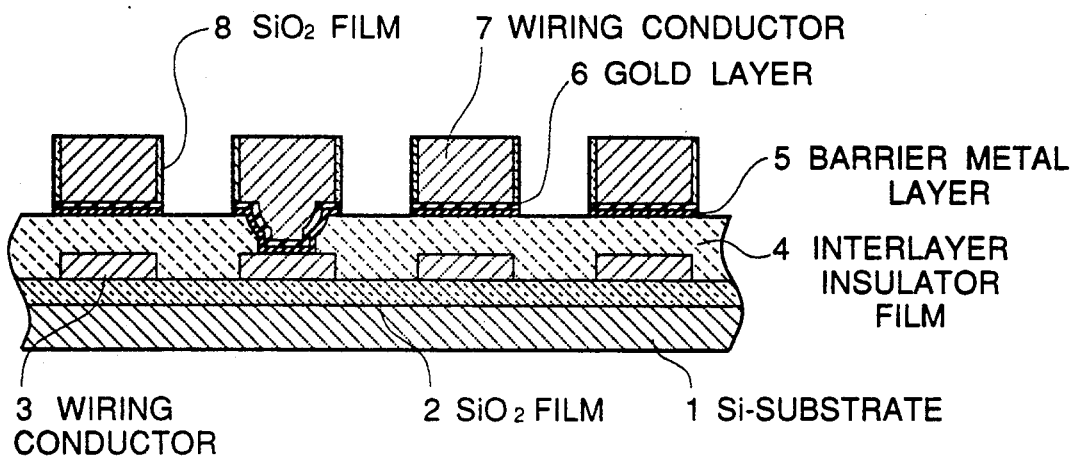

Then, as shown in FIG. 1E, the deposited silicon oxide film 8 is etched back by an anisotropic etching, so that the silicon oxide film 8 excluding a portion deposited on side surfaces of the wiring conductors 7 is removed. Thereafter, the gold layer 6 and the barrier metal layer 5 are removed in the named order by a sputter etching using an inert gas such as Ar, using the wiring conductors 7 and the remaining silicon oxide film 8 as a mask. In this process, it is in some cases that a portion of the removed metal is adhered to the surfaces of the silicon oxide film 8 remaining on the side surfaces of the wiring conductors 7.

Figure 1F:
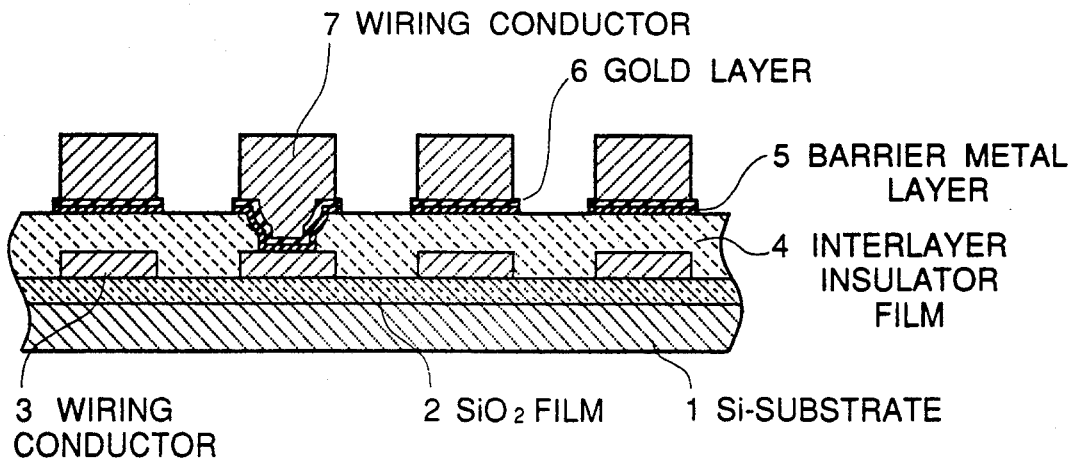

Thereafter, as shown in FIG. 1F, the remaining silicon oxide film 8 to which the metal deposit may be adhered in some cases, is etch-removed by use of a dilute hydrofluoric acid.

In the above mentioned embodiment, in place of the silicon oxide film 8, a silicon nitride film can be deposited by a plasma CVD process. This modification is advantageous in that the silicon nitride film remaining on only the side surfaces of the wiring conductors 7 can be easily removed together with the metal deposit adhered thereto, by an isotropic dry etching using $CF_4$ gas or others. In addition, in place of the gold layer deposited by the plating, the wiring conductors 7 can be formed of a copper layer deposited by the plating.

Figure 2:
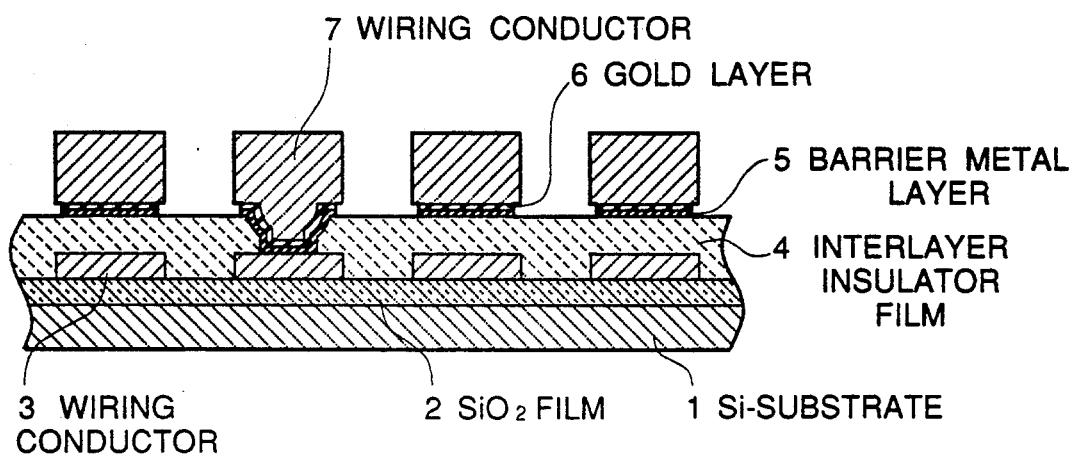
FIG. 2 is a sectional view of a semiconductor device, for illustrating the process of the second embodiment of the present invention.

FIG. 2 is a sectional view of a semiconductor chip for illustrating a second embodiment of the method of the present invention.

The process of the second embodiment is the same as that of the first embodiment until the step shown in FIG. 1E.

After the gold layer 6 and the barrier metal layer 5 are removed in the named order by a sputter etching using the upper level wiring conductors 7 and the remaining silicon oxide film 8 as a mask as shown in FIG. 1E, the gold layer 6 is wet-etched by aqua regia, and the barrier metal layer 5 is wet-etched by $H_2O_2$ solution, as shown in FIG. 2, so that a most portion of the metal deposit adhered to the silicon oxide film 8 is etch-removed. Thereafter, the remaining silicon oxide film 8 is removed by a wet etching (dilute hydrofluoric acid or the like), together with the metal deposit adhered thereto. The metal deposit produced by the sputter etching can be removed more completely than the first embodiment.

As seen from the above, the method of the present invention is characterized in that after an insulator film is formed on side surfaces of the upper level wiring conductor formed by the electroplating process, the power supply layer for electroplating is removed by the sputter etching, and thereafter, the insulator film on which the metal deposit produced by the sputter etching may be deposited, is etch-removed. Namely, the metal deposit can be removed at the same time as the insulator film is removed. Therefore, it is possible to prevent short-circuiting of adjacent wiring conductors which is caused because the metal deposit peels off in succeeding processes. Accordingly, the fabrication yield and the reliability can be elevated.

The invention has thus been shown and described with reference to the specific embodiments. However, it should be noted that the present invention is in no way limited to the details of the illustrated structures but changes and modifications may be made within the scope of the appended claims.

I claim:

1. A method for manufacturing a semiconductor device, comprising the steps of forming an interlayer insulator layer on a semiconductor substrate; forming a power supply layer for electroplating on an upper surface of said interlayer insulator layer; depositing on said power supply layer a patterned photoresist layer having a plurality of grooves for formation of a plurality of wiring conductors; depositing a metal layer on said power supply layer as a mask so that the wiring conductor is formed within each of said grooves; removing said photoresist layer; conformably depositing an insulator film on top and side surfaces including a surface of said wiring conductors; etching back the deposited insulator film so that the deposited insulator film remains on only side surfaces of said wiring conductors and the upper surface of said power supply layer is exposed; removing said power supply layer by etching while using said wiring conductors and said remaining deposited insulator film as a mask; and etching away said remaining deposited insulator film.

2. A method claimed in claim 1 wherein after formation of said interlayer insulator layer, a contact hole in alignment with a lower level wiring conductor formed under said interlayer insulator layer is selectively formed in said interlayer insulator layer, and then, said patterned photoresist layer having a plurality of grooves is deposited on said power supply layer in such a manner that at least one of said grooves is in alignment with said contact hole.

3. A method claimed in claim 1 wherein said deposited insulator film is etched back by an anisotropic etching, so that said deposited insulator film excluding a portion deposited on side surfaces of said wiring conductors is removed.

4. A method claimed in claim 1 wherein said power supply layer is formed of a barrier metal layer deposited on said interlayer insulator film and a gold layer deposited on said barrier metal layer, and wherein said power supply layer is removed by removing said gold layer and said barrier metal layer in the named order by a sputter etching using an inert gas while using said wiring conductors and the remaining deposited insulator film as a mask.

5. A method claimed in claim 1 wherein said insulator film is formed of a silicon oxide film, and said removal of said remaining deposited insulator film formed of the silicon oxide film is performed by etching with a dilute hydrofluoric acid.

6. A method claimed in claim 1 wherein said insulator film is formed of a silicon nitride film, and said removal of said remaining deposited insulator film formed of the silicon nitride film is performed by etching with an isotropic dry etching.

7. A method claimed in claim 1 wherein said power supply layer is formed of a barrier metal layer deposited on said interlayer insulator film and a gold layer deposited on said barrier metal layer, and wherein after said power supply layer is removed using said wiring conductors and the remaining deposited insulator film as a mask, said gold layer is wet-etched by aqua regia, and said barrier metal layer is wet-etched by $H_2O_2$ solution, so that most of the metal deposit which might be adhered to the remaining deposited insulator film is etch-away, and thereafter, the remaining deposited insulator film is removed by a wet etching.

8. A method for manufacturing a semiconductor device, comprising the steps of forming on a semiconductor substrate an interlayer insulator layer having a planarized upper surface; selectively forming in said interlayer insulator layer a contact hole in alignment with a lower level wiring conductor formed under said interlayer insulator layer; forming a power supply layer for electroplating on said upper surface of said interlayer insulator layer including a surface of said contact hole; depositing a photoresist layer on said power supply layer; patterning said deposited photoresist layer so as to form a groove for formation of an upper level wiring conductor, said groove being in alignment with said contact hole; depositing a metal layer on said power supply layer by an electroplating process using said photoresist layer as a mask so that said second level wiring conductor is formed within said groove; removing said photoresist layer; conformably depositing an insulator film on a surface including top and side surfaces of said second level wiring conductor; etching back the deposited insulator film so that the deposited insulator film remains on only side surfaces of said second level wiring conductor and the upper surface of said power supply layer is exposed; removing said power supply layer by etching while using said second level wiring conductor and said remaining deposited insulator film as a mask; and etching away said remaining deposited insulator film.

9. A process for manufacturing a semiconductor device having a multi-layer wiring structure, including the steps of forming a power supply layer for electroplating on an interlayer insulator layer, forming a patterned second level wiring conductor on said power supply layer, conformably depositing an insulator film on top and side surfaces of said second level wiring conductor, etching back said insulator film so that said insulator film remains only on the side surfaces of said second level wiring conductor, removing said power supply layer by a sputter etching while using said remaining insulator film and said second level wiring conductor as a mask, and etching away said remaining insulator film together with metal deposits which might be adhered to the surface of said remaining insulator film at the time of said sputter etching.

* * * * *